United States Patent [19]
Tokunaga

[11] Patent Number: 6,034,421
[45] Date of Patent: Mar. 7, 2000

[54] SEMICONDUCTOR DEVICE INCLUDING MOLDED IC FIXED TO CASING

[75] Inventor: Masatoshi Tokunaga, Chiryu, Japan

[73] Assignee: Denso Corporation, Kariya, Japan

[21] Appl. No.: 08/982,034

[22] Filed: Dec. 1, 1997

[30] Foreign Application Priority Data

Dec. 9, 1996 [JP] Japan ................................ 8-328793

[51] Int. Cl.[7] ............................................. H01L 23/48
[52] U.S. Cl. ........................ 257/666; 257/787; 257/790
[58] Field of Search ................................ 257/787, 790, 257/678, 666, 676, 793

[56] References Cited

U.S. PATENT DOCUMENTS 5,793,118 8/1998 Nakajima ................................ 257/790

FOREIGN PATENT DOCUMENTS

4-179152 6/1992 Japan .
4-179283 6/1992 Japan .

*Primary Examiner*—Carl Whitehead, Jr.
*Assistant Examiner*—Roy Potter
*Attorney, Agent, or Firm*—Pillsbury Madison & Sutro LLP

[57] ABSTRACT

A molded IC having external terminals are fixed to a casing. The casing is provided with terminals by insert molding. Then, the external terminals of the molded IC are respectively fixed to the terminals fixed to the casing. In this case, a pitch $L_1$ of the external terminals of the molded IC and a pitch $L_2$ of the terminals fixed to the casing are chosen so that a difference between a product of the pitch $L_1$ and a thermal expansion coefficient of resin for the molded IC and a product of the pitch $L_2$ and a thermal expansion coefficient of resin for the casing becomes as small as possible. As a result, fixed portions between the external terminals of the molded IC and the terminals fixed to the casing can be prevented from being subject to excessive stress, even when the molded IC and the casing are thermally expanded.

25 Claims, 7 Drawing Sheets

SEMICONDUCTOR DEVICE INCLUDING MOLDED IC FIXED TO CASING

CROSS REFERENCE TO RELATED APPLICATION

This application is based upon and claims the benefit of priority of prior Japanese Patent Application No. 8-328793 filed on Dec. 9, 1996, the contents of which are incorporated herein by reference.

BACKGROUND OF THE INVENTION

1. Field of the Invention

The present invention relates to a semiconductor device including a molded IC fixed to a casing, which is adopted to, for example, a pressure sensor apparatus for a vehicle and the like.

2. Related Arts

Figure 1:
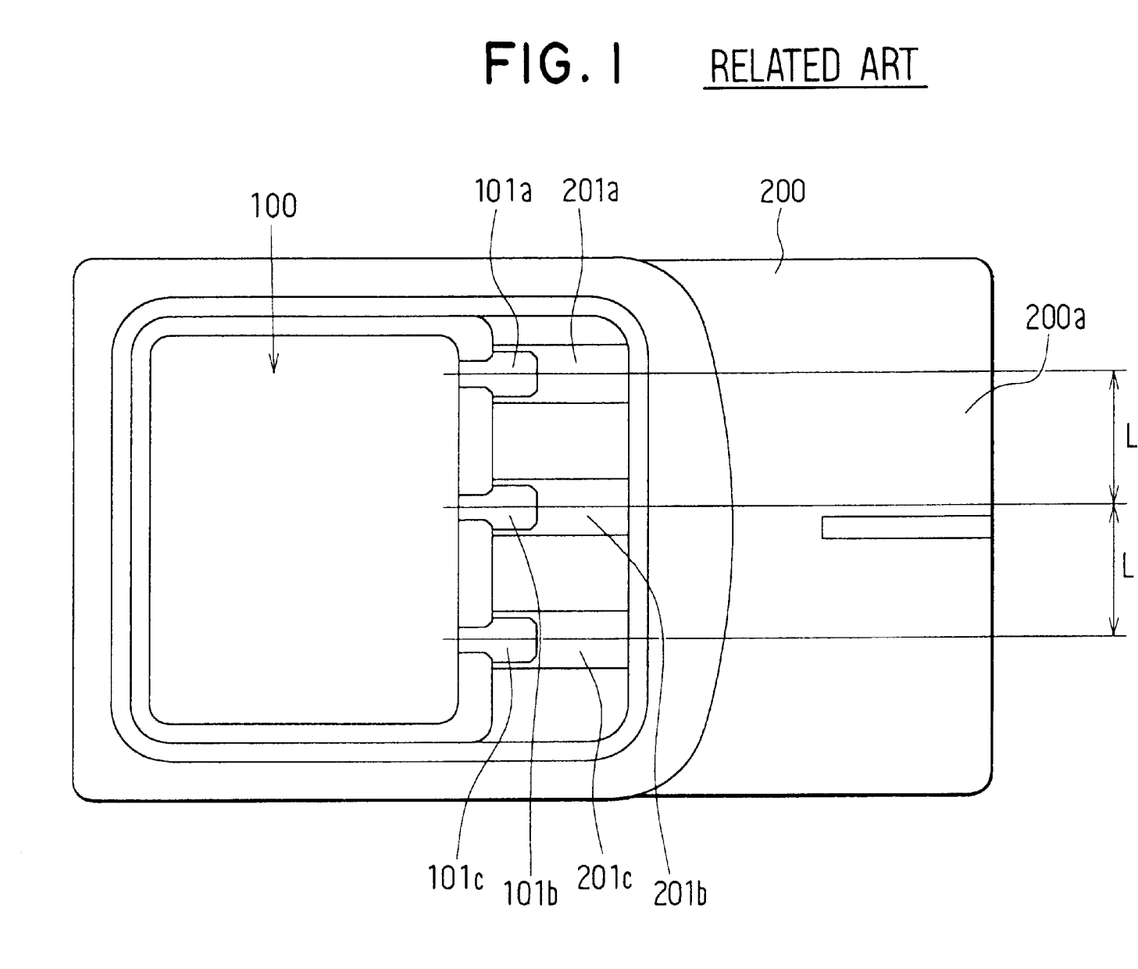
FIG. 1 is a plan view showing a pressure sensor apparatus according to a related art.

FIG. 1 illustrates a sensor apparatus having a molded IC 100 fixed to a casing 200. The sensor apparatus is not a prior art, and is a work of the inventor of the present invention. In FIG. 1, the molded IC 100 contains a signal processing IC. External terminals 101a, 101b, and 101c are taken out from the signal processing IC to respectively serve as a power source terminal, a signal terminal, and a ground terminal. The molded IC 100 is retained within the casing 200 made of resin. The casing 200 is provided with three terminals 201a, 201b, and 201c by an insert molding method. Each end of the terminals 201a, 201b, and 201c extends into a connector portion 200a, while the other end of each of the terminals 201a, 201b, and 201c is fixed to the external terminals 101a, 101b, and 101c of the molded IC 100 by welding to get an electrically communicating state therebetween.

In the above-described constitution, provided that the molded IC 100 and the casing 200 are respectively made of resin materials different from each other and therefore they have different thermal expansion coefficients, the change in size of the molded IC 100 due to thermal expansion or thermal contraction in accordance with environmental temperature change is different from that of the casing 200. Therefore, when a pitch L of the external terminals 101a, 101b, and 101c of the molded IC 100 is equal to a pitch of the terminals 201a, 201b, and 201c, excessive stress is applied to respective fixed portions between the external terminals 101a, 101b, and 101c and the terminals 201a, 201b, and 201c due to thermal expansion or thermal contraction, resulting in fatigue failures of the fixed portions.

SUMMARY OF THE INVENTION

The present invention has been made in view of the above-mentioned problem and an object of the present invention is to provide a semiconductor device including a molded IC fixed to a casing, and having a structure capable of preventing an excessive stress from being applied to fixed portions between external terminals of the molded IC and terminals fixed to the casing even when the molded IC and the casing have different thermal expansion coefficients.

According to the present invention, in a semiconductor device including a molded IC fixed to a casing, the casing is made of resin having a first thermal expansion coefficient and the molded IC is molded with resin having a second thermal coefficient. Further, first terminals are fixed to the casing and has a first pitch therebetween. Second terminals are insert-molded within the molded IC at a second pitch, and are respectively connected to the first terminals. The first and second pitches are determined so that a difference between a product of the first thermal expansion coefficient and the first pitch, and a product of the second thermal expansion coefficient and the second pitch becomes as small as possible. As a result, fixed portions between the first and second terminals can be prevented from being subject to excessive stress.

Preferably, the first and second pitches are determined so that the product of the first thermal expansion coefficient and the first pitch is equal to the product of the second thermal expansion coefficient and the second pitch.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENT

Figure 2:
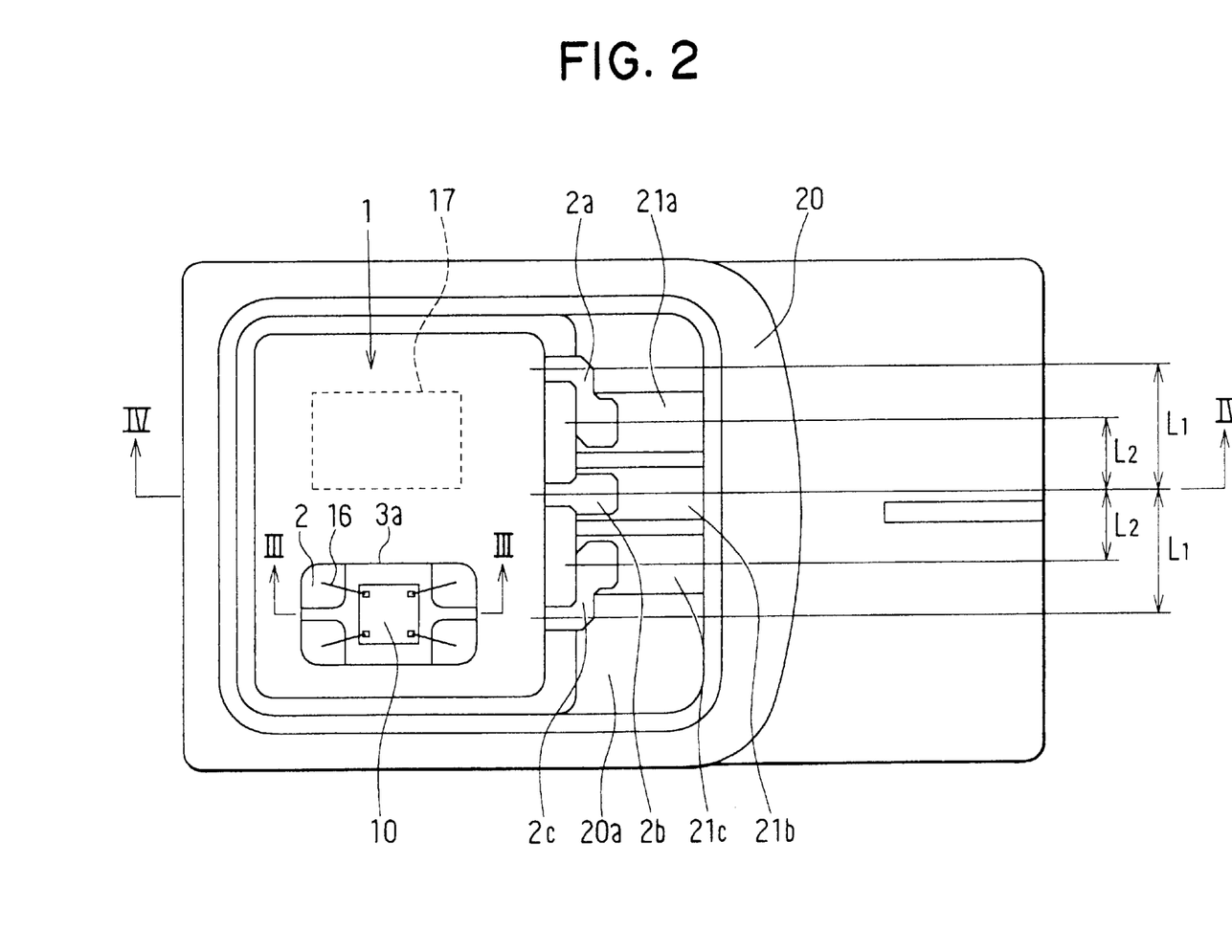
FIG. 2 is a plan view showing a pressure sensor apparatus in a preferred embodiment according to the present invention.
Figure 3:
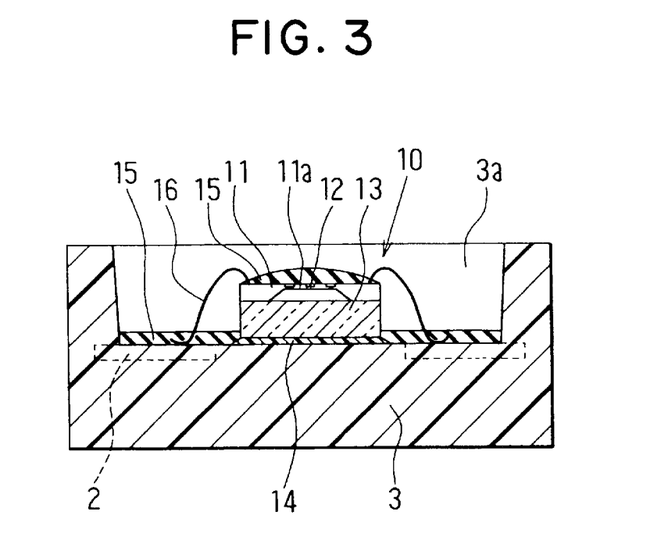
FIG. 3 is a cross-sectional view taken along a III—III line in FIG. 1, showing a molded IC in the pressure sensor apparatus in the embodiment.
Figure 4:
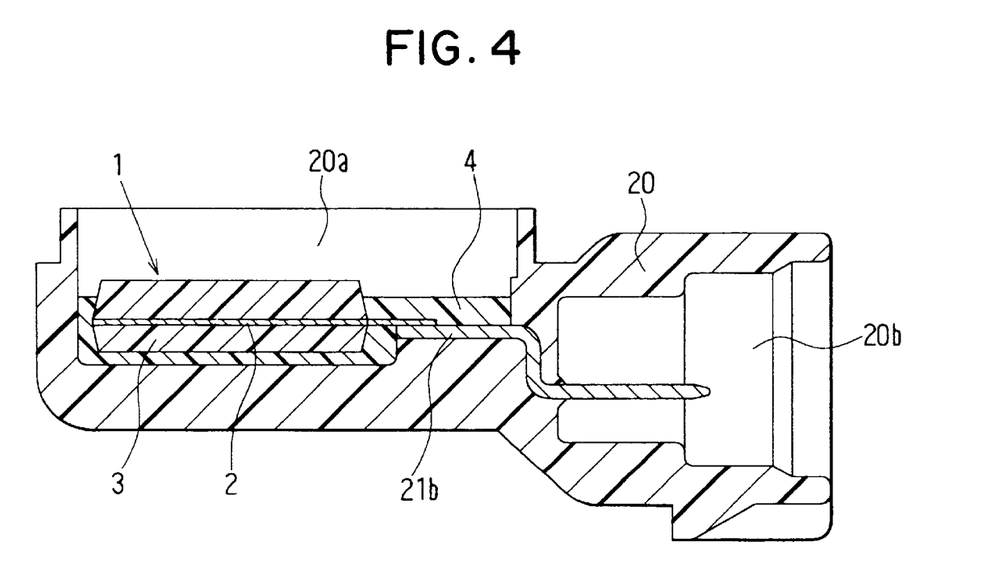
FIG. 4 is a cross-sectional view taken along a IV—IV line in FIG. 1, showing the pressure sensor apparatus in the embodiment.

A preferred embodiment according to the present invention will be described hereinunder with reference to the drawings. A pressure sensor apparatus illustrated in FIGS. 2 to 4 is used for an intake pressure sensor for a vehicle, and holds a molded IC 1 within a casing 20. The molded IC in the present invention means an element that is partially molded and holds an IC chip from which an external terminal protrudes.

The molded IC 1 is formed from epoxy resin by molding to hold a lead frame 2 (indicated by dotted lines in FIG. 3) made of 42 alloy in a molded portion 3 made of resin. The molded portion 3 has an opening 3a on which a sensing member 10 for detecting a pressure is to be disposed. The sensing member 10 is, as illustrated in FIG. 3, composed of a sensor chip 11 made of a silicon substrate and a glass base 13 joined to the sensor chip 11 by anode coupling. The sensor chip 11 is formed with a diaphragm 11a that is displaced in response to the pressure. Further, diffusion gauges 12 are formed on the surface of the diaphragm 11a so that each value of resistance of the diffusion gauges 12 changes in accordance with the displacement of the diaphragm 11a.

The above-described sensing member 10 is bonded to the molded portion 3 within the opening 3a by resinous adhesives 14. Then, a gel-like protective material 15 is coated on the sensing member 10 as well as on the molded portion 3 around the sensing member 10 as illustrated in FIG. 3. The diffusion gauges 12 formed on the surface of the sensing chip 11 is electrically connected to the lead frame 2 through bonding wires 16 and an aluminum wiring pattern formed on the sensor chip 11. Electrical signals generated from the diffusion gauges 12 are inputted into a signal processing IC 17 indicated by a dotted rectangular line in FIG. 2 and outputted from the signal processing IC 17 as sensor signals. The signal processing IC 17 is provided on the lead frame 2 to be electrically connected to external terminals 21a, 21b, and 21c of the lead frame 2 within the molded IC 1. The external terminals 21a, 21b, and 21c respectively serve as a power source terminal, a ground terminal and a sensor signal output terminal for the signal processing IC 17.

The casing 20 has, as illustrated in FIGS. 2 and 4, an opening 20a for holding the molded IC 1 therein and a connector portion 20b. Further, three terminals 21a, 21b, and 21c made of copper are disposed within the casing 20 by an insert molding. Each end of the terminals 21a, 21b, and 21c protrude into the connector portion 20b to make a contact with an external circuit. The other ends of the terminals 21a, 21b, and 21c are respectively fixed to the external terminals 2a, 2b, and 2c of the lead frame 2 in an electrically communicating state.

The molded IC 1 is fixed to the casing 20 within the opening 20a by a resin casting material (potting material) 4 to have flexibility in a longitudinal direction of the external terminals 2a, 2b, and 2c. At the same time, the external terminals 2a, 2b, and 2c and the terminals 21a, 21b, and 21c exposed within the opening 20a are covered with the resin casting material 4. Accordingly, invasion of water and the like into the molded IC 1 through interfaces between each of the external terminals 2a, 2b, and 2c, and the molded portion 3 can be prevented. In addition, corrosion of the terminals 21a, 21b, and 21c can be prevented, thereby avoiding electrical leakage therefrom.

In this embodiment, thermoplastic resin such as epoxy resin is employed as the molding resin for the molded IC 1, and thermosetting resin such as polybutyleneterephthalate (PBT) is employed as resin for the casing 20. The thermal expansion coefficient of epoxy resin ($\alpha_1$) is approximately $2 \times 10^{-5}/°C$., and the thermal expansion coefficient of PBT ($\alpha_2$) is approximately $6 \times 10^{-5}/°C$. Thus, the thermal expansion coefficients of the molded IC 1 and the casing 20 are different from each other, so that the fixed portions between the external terminals 2a, 2b, and 2c, and the terminals 21a, 21b, and 21c are likely to be subject to stress in a high temperature environment. Here, the material for the molded IC 1 is chosen based on adhesion relative to the lead frame 2, a relationship relative to a thermal expansion coefficient of the sensor chip 11, and the like. On the other hand, the material for the casing 2 is chosen based on processing performance, recycling performance, and the like.

Therefore, to prevent the stress at the fixed portions, in this embodiment, a pitch $L_1$ (FIG. 2) of the external terminals 2a, 2b, and 2c and a pitch $L_2$ (FIG. 2) of the terminals 21a, 21b, and 21c are set to be different from each other so that the thermally expanded spacing between the external terminals 2a, 2b, and 2c becomes approximately equal to the thermally expanded spacing between the terminals 21a, 21b, and 21c. Specifically, when a change in temperature is $\Delta T$, the thermally expanded spacing between the external terminals 2a, 2b, and 2c is represented by $\alpha_1 \cdot L_1 \cdot \Delta T$, and the thermally expanded spacing between the terminals 21a, 21b, and 21c is represented by $\alpha_2 \cdot L_2 \cdot \Delta T$. Therefore, the pitches $L_1$ and $L_2$ are chosen so that both of the thermally expanded amounts $\alpha_1 \cdot L_1 \cdot \Delta T$ and $\alpha_2 \cdot L_2 \cdot \Delta T$ become equal to each other.

However, because the space where the external terminals 2a, 2b, and 2c and the terminals 21a, 21b, and 21c are arranged is restricted within the opening 20a of the casing 20, there is a case where the thermally expanded amounts of $\alpha_1 \cdot L_1 \cdot \Delta T$ and $\alpha_2 \cdot L_2 \cdot \Delta T$ cannot be set to be equal to each other. In such a case, the pitches $L_1$ and $L_2$ are set so that a difference between amounts of $\alpha_1 \cdot L_1$ and $\alpha_2 \cdot L_2$ becomes as small as possible. Accordingly, the stress applied to the fixed portions between the external terminals 2a, 2b, and 2c and the terminals 21a, 21b, and 21c are as small as possible.

Figure 5:
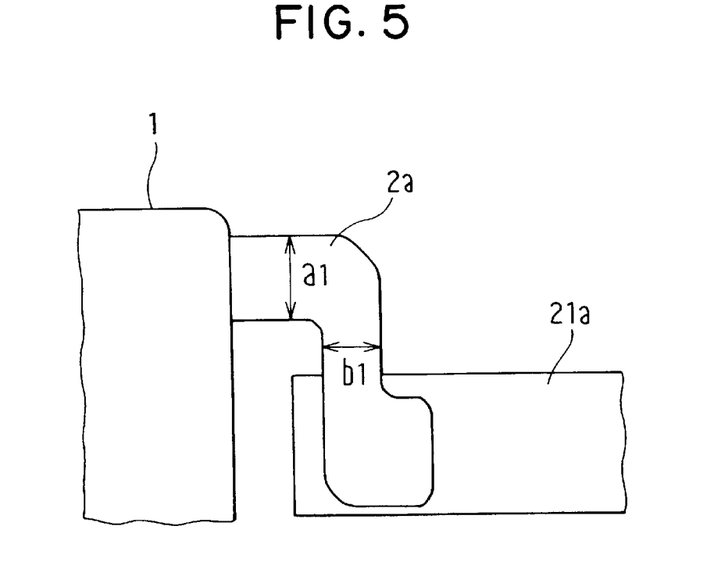
FIG. 5 is a partially enlarged plan view of the pressure sensor apparatus, schematically showing a shape of an external terminal in the embodiment.

In this embodiment, because the thermal expansion coefficient $\alpha_2$ of the casing 2 is three times larger than the thermal expansion coefficient $\alpha_1$ of the molded IC 1, the pitch $L_1$ of the external terminals 2a, 2b, and 2c is to be three times longer than the pitch $L_2$ of the terminals 21a, 21b, and 21c to prevent the stress at the fixed portions. However, it is difficult to obtain such a relationship of the pitches $L_1$ and $L_2$ due to the restricted space. Therefore, in this embodiment, the pitch $L_1$ of the external terminals 2a, 2b, and 2c is set as large as possible compared to the pitch $L_2$. In addition, as illustrated in FIGS. 2 and 5, each of the external terminals 2a and 2c is provided with a first portion protruding from the molded IC 1 at the pitch $L_1$ and a second portion extending from the first portion approximately perpendicularly to the first portion. Further, a width b1 of the second portion perpendicular to an extending direction thereof is smaller than a width a1 of the first portion perpendicular to a protruding direction thereof. Accordingly, the external terminals 2a and 2c can be easily deformed. Therefore, although the pitches $L_1$ and $L_2$ cannot be set to completely prevent the stress at the fixed portions between the external terminals 2a, 2b, and 2c and the terminals 21a, 21b, and 21c, the stress can be absorbed in the external terminals 2a and 2c. This is very effective to prevent fatigue failures at the fixed portions.

Figure 6:
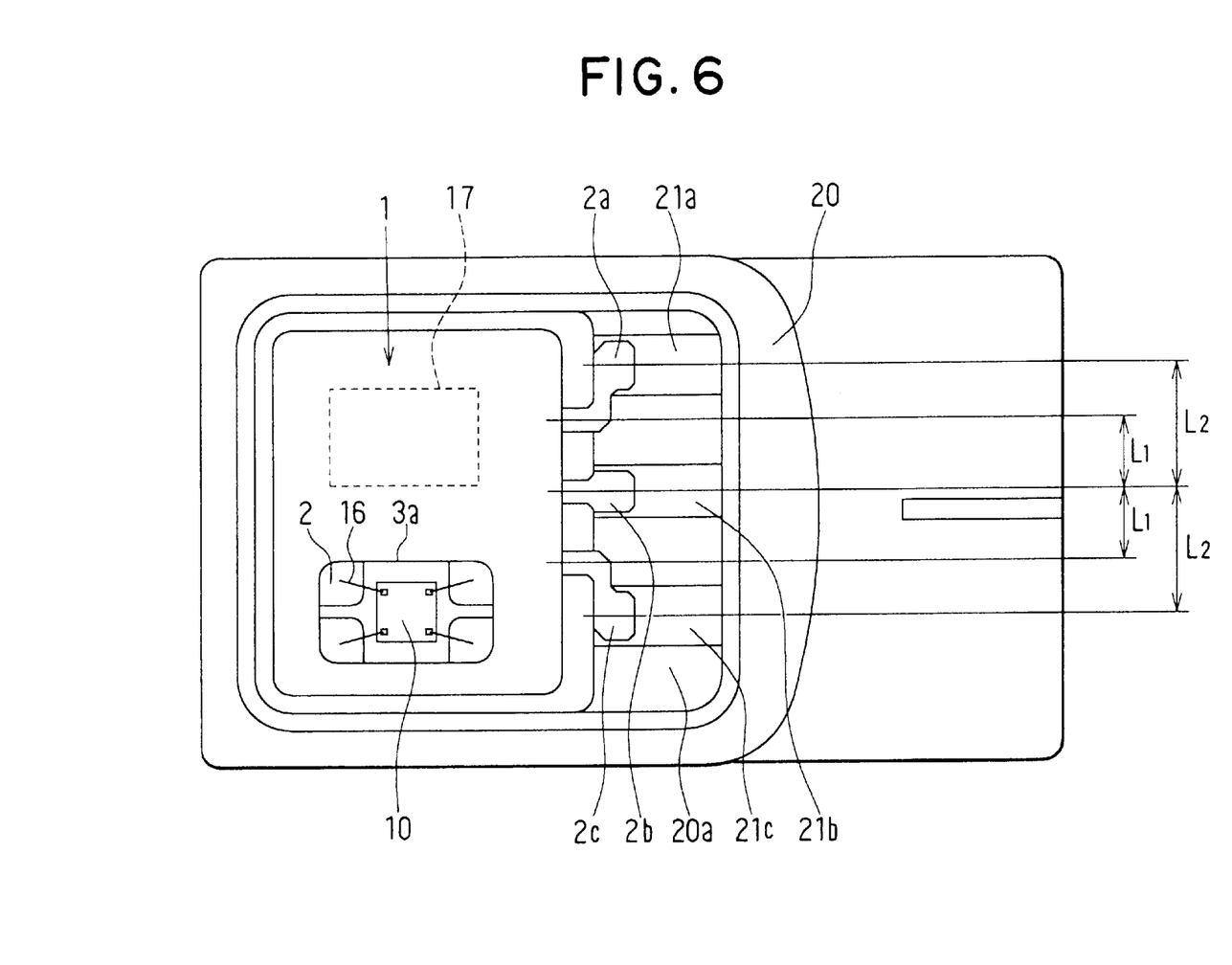
FIG. 6 is a plan view showing a pressure sensor apparatus in a modified embodiment according to the present invention.
Figure 7:
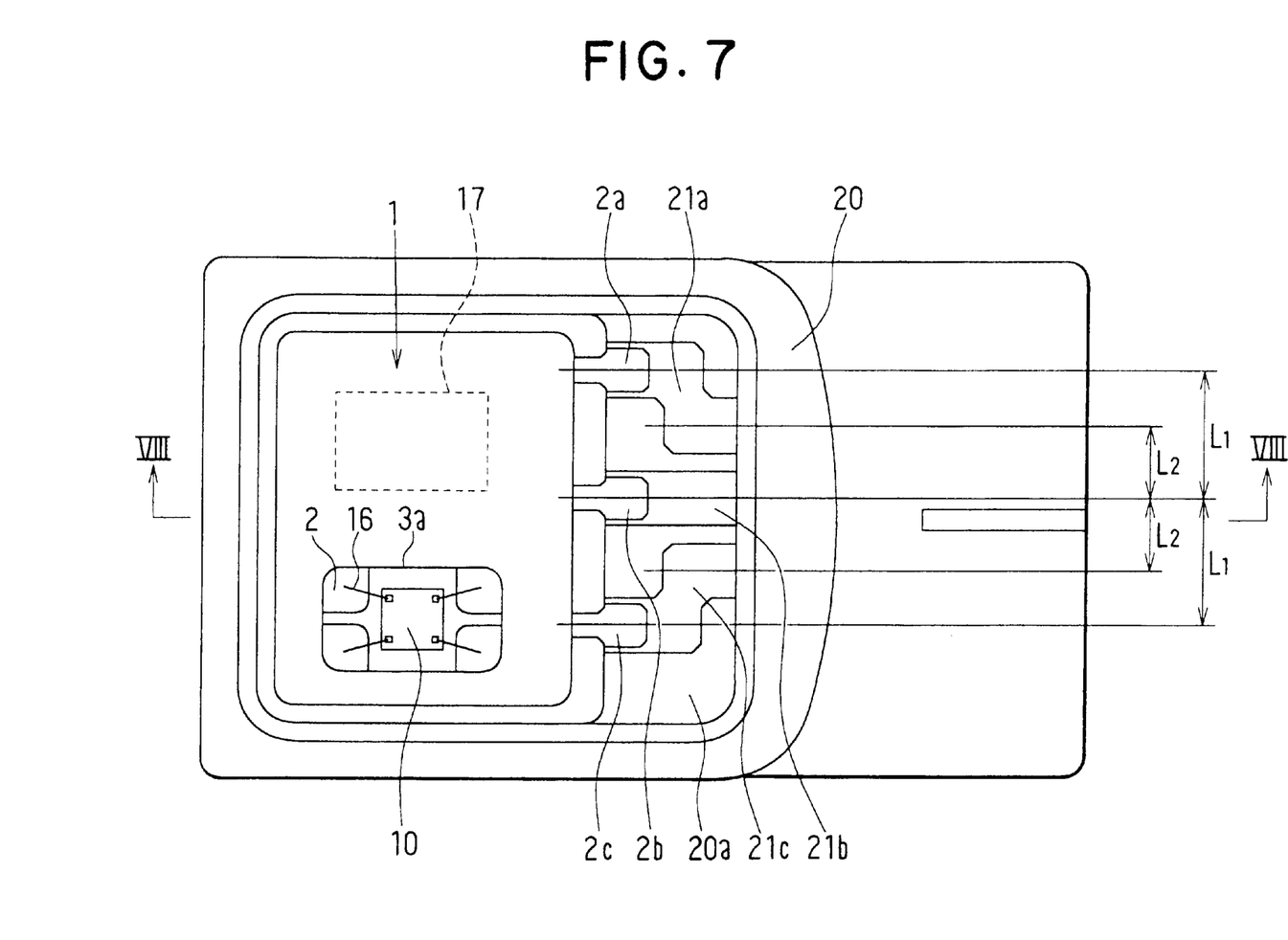
FIG. 7 is a plan view showing a pressure sensor apparatus in another modified embodiment according to the present invention.
Figure 8:
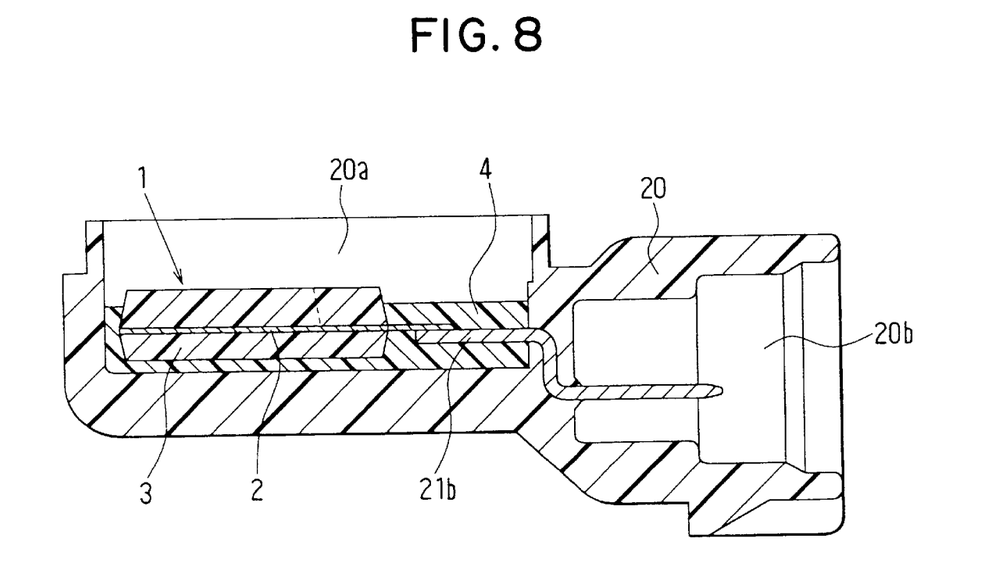
FIG. 8 is a cross-sectional view taken along a VIII—VIII line in FIG. 7, showing the pressure sensor apparatus.

In a case where the thermal expansion coefficient $\alpha_1$ of the molded IC 1 is larger than the thermal expansion coefficient $\alpha_2$ of the casing 2, the pitch $L_2$ of the terminals 21a, 21b, and 21c is set to be larger than the pitch $L_1$ of the external terminals 2a, 2b, and 2c by changing the shapes of the external terminals 2a, 2b, and 2c as illustrated in FIG. 6. Instead of changing the shapes of the external terminals 2a, 2b, and 2c, the shapes of the terminals 21a, 21b, and 21c may be changed as illustrated in FIG. 7. In this case, if each end of the terminals 21a, 21b, and 21c is fixed to the casing 20 as illustrated in FIG. 4, it is difficult to change the shapes of the terminals 21a, 21b, and 21c. Therefore, in such a case, as illustrated in FIG. 8, the ends of the terminals 21a, 21b, and 21c protrude from the casing 20 at the pitch $L_2$ not to directly be fixed to the casing 20.

Figure 9:
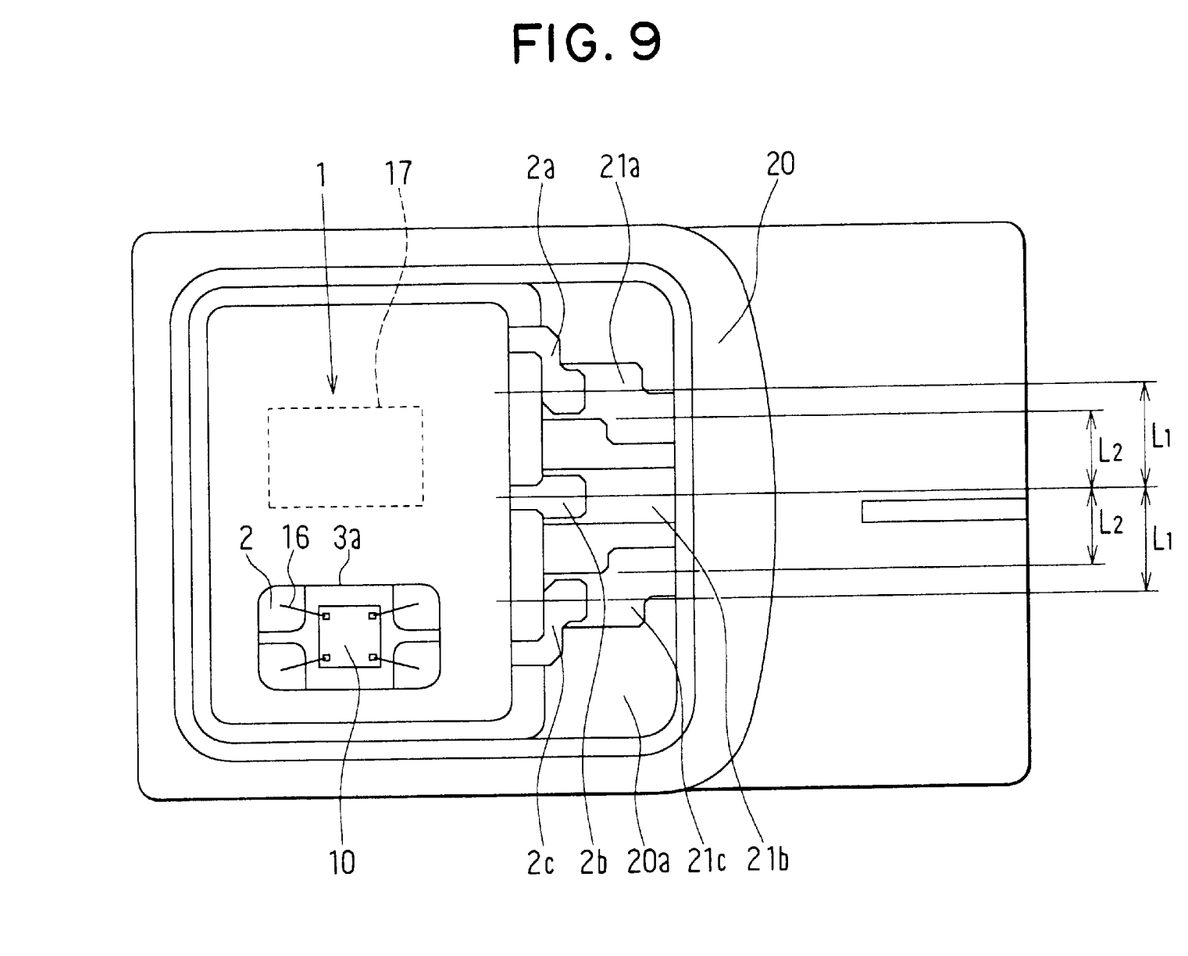
FIG. 9 is a plan view showing a pressure sensor apparatus in another modified embodiment according to the present invention.

Further, as illustrated in FIG. 9, the shapes of the external terminals 2a, 2b, and 2c in addition to the shapes of the terminals 21a, 21b, and 21c may be changed. Here, when the terminals 21a, 21b, and 21c protrude from the casing 20 as illustrated in FIG. 8, the pitch $L_2$ of the terminals is an interval between root portions of the terminals. When the terminals 21a, 21b, and 21c are fixed to the casing 20 as illustrated in FIG. 4, the pitch $L_2$ of the terminals is an interval between front end portions of the terminals. Likewise, the pitch $L_1$ of the external terminals 2a, 2b, and 2c is an interval between root portions of the external terminals from the molded IC 1.

While the present invention has been shown and described with reference to the foregoing preferred embodiment, it will be apparent to those skilled in the art that changes in form and detail may be made therein without departing from the scope of the invention as defined in the appended claims. For example, the molded IC 1 and the casing 20 may be made of materials other than the above-described materials. Specifically, the casing 20 may be made of polyphenylene sulfide (PPS), and may be made of metal provided that the terminals 21a, 21b, and 21c are insulated from the casing 20. The molded IC 1 and the casing 2 may include the same filler or different fillers such as glass, carbon, aluminum, and the like.

The external terminals 2a, 2b, and 2c can be fixed to the terminals 21a, 21b, and 21c by welding, soldering, caulking, or the like. Further, if the molded IC 1 has an opening to expose upper portions of the external terminals 2a, 2b, and 2c as indicated by a dotted line in FIG. 8, workability for respectively fixing the external terminals 2a, 2b, and 2c to the terminals 21a, 21b, and 21c can be improved.

The lead frame 2 and the terminals 21a, 21b, and 21c are respectively made of metals different from each other as in the above-described embodiment, and may be made of the same metal such as copper. Although the casing 20 holds the molded IC 1 therein in the above-described embodiment, another type of casing capable of fixing the molded IC thereto can be also applicable. The present invention can be applied not only to the sensing apparatus including a signal processing IC for a sensor but also the other apparatuses including signal processing IC used for elements other than the sensor.

Variations such as those described above are to be understood as being within the scope of the present invention as defined by the appended claims.

What is claimed is:

1. A semiconductor device comprising:
   a casing made of a first resin having a first thermal expansion coefficient;
   a molded IC including an IC chip molded with a second resin having a second thermal expansion coefficient different from the first thermal expansion coefficient;
   first terminals fixed to the casing and having end portions exposed from the casing at a first pitch; and
   second terminals electrically connected to the IC chip and having end portions protruding from the molded IC at a second pitch and being electrically connected to the first terminals,
   wherein the first and second pitches of the first and second terminals are determined to decrease a difference between a first product of the first pitch and the first thermal expansion coefficient, and a second product of the second pitch and the second thermal expansion coefficient.

2. The semiconductor device according to claim 1, wherein the first product of the first thermal expansion coefficient and the first pitch is equal to the second product of the second thermal expansion coefficient and the second pitch.

3. The semiconductor device according to claim 1, wherein the first resin is thermosetting resin and the second resin is thermoplastic resin.

4. The semiconductor device according to claim 3, wherein the first resin is polybutyleneterephthalate, and the second resin is epoxy resin.

5. The semiconductor device according to claim 1, wherein the molded IC includes a pressure sensor element.

6. The semiconductor device according to claim 1, wherein the molded IC has flexibility in a longitudinal direction of the second terminals.

7. The semiconductor device according to claim 1, wherein each of the end portions of the second terminals includes a first part protruding from the molded IC with a first width perpendicular to a protruding direction thereof, and a second part extending from the first part with a second width perpendicular to an extending direction thereof and having a fixed portion electrically contacting corresponding one of the first terminals at an end thereof opposite to the molded IC, the fixed portions of the second terminals being disposed at a third pitch different from the second pitch.

8. The semiconductor device according to claim 1, wherein each of the end portions of the first terminals includes a first part protruding from the casing with a first width perpendicular to a protruding direction thereof, and a second part extending from the first part with a second width perpendicular to an extending direction thereof and having a fixed portion electrically contacting corresponding one of the second terminals at an end thereof opposite to the casing, the fixed portions of the first terminals being disposed at a fourth pitch different from the first pitch.

9. A semiconductor device comprising:
   a casing made of a first resin having a first thermal expansion coefficient;
   a molded IC molded with a second resin having a second thermal expansion coefficient smaller than the first thermal expansion coefficient;
   first terminals fixed to the casing and having end portions exposed from the casing at a first pitch; and
   second terminals connected to the molded IC and having end portions protruding from the molded IC at a second pitch larger than the first pitch, the end portions being electrically contacting the first terminals.

10. The semiconductor device according to claim 9, wherein a product of the first thermal expansion coefficient and the first pitch is substantially equal to a product of the second thermal expansion coefficient and the second pitch.

11. The semiconductor device according to claim 9, wherein the first resin is polybutyleneterephthalate, and the second resin is epoxy resin.

12. The semiconductor device according to claim 9, wherein each of the end portions of the second terminals includes a first part protruding from the molded IC at the second pitch and a second part extending from the first part and having a fixed portion electrically contacting corresponding one of the first terminals at an end thereof opposite to the molded IC, the fixed portions of the second terminals being disposed at a third pitch smaller than the second pitch.

13. The semiconductor device according to claim 12, wherein each of the first parts of the second terminals has a first width perpendicular to a protruding direction thereof, and each of the second parts of the second terminals has a second width perpendicular to an extending direction thereof, the second width being smaller than the first width.

14. The semiconductor device according to claim 12, wherein the second part of each of the second terminals is substantially perpendicular to the first part thereof.

15. The semiconductor device according to claim 9, wherein each of the end portions of the first terminals includes a first part protruding from the casing at the first pitch and a second part extending from the first part and having a fixed portion electrically contacting corresponding one of the second terminals at an end thereof opposite to the casing, the fixed portions of the first terminals being disposed at a fourth pitch larger than the first pitch.

16. A semiconductor device comprising:
a casing made of a first resin having a first thermal expansion coefficient;
first terminals fixed to the casing and having end portions exposed from the casing at a first pitch;
a molded IC molded with a second resin having a second thermal expansion coefficient larger than the first thermal expansion coefficient; and
second terminals connected to the molded IC and having end portions protruding from the molded IC at a second pitch smaller than the first pitch, the end portions being electrically contacting the first terminals.

17. The semiconductor device according to claim 16, wherein a product of the first thermal expansion coefficient and the first pitch is substantially equal to a product of the second thermal expansion coefficient and the second pitch.

18. The semiconductor device according to claim 16, wherein each of the end portions of the second terminals includes a first part protruding from the molded IC at the second pitch and a second part extending from the first part and having a fixed portion electrically contacting corresponding one of the first terminals at an end thereof opposite to the molded IC, the fixed portions of the second terminals being disposed at a third pitch larger than the second pitch.

19. The semiconductor device according to claim 18, wherein each of the first parts of the second terminals has a first width perpendicular to a protruding direction thereof, and each of the second parts of the second terminals has a second width perpendicular to an extending direction thereof, the second width being smaller than the first width.

20. The semiconductor device according to claim 16, wherein each of the end portions of the first terminals includes a first part protruding from the casing at the first pitch and a second part extending from the first part and having a fixed portion electrically contacting corresponding one of the second terminals at an end thereof opposite to the casing, the fixed portions of the first terminals being disposed at a fourth pitch smaller than the first pitch.

21. The semiconductor device according to claim 9, wherein the molded IC has flexibility in a longitudinal direction of the second terminals.

22. The semiconductor device according to claim 9, wherein the first resin is thermosetting resin and the second resin is thermoplastic resin.

23. The semiconductor device according to claim 9, wherein the end portions of the second terminals protrude from the second resin encapsulating the molded IC therein, and are connected to the first terminals outside the second resin.

24. The semiconductor device according to claim 16, wherein the molded IC has flexibility in a longitudinal direction of the second terminals.

25. The semiconductor device according to claim 16, wherein the end portions of the second terminals protrude from the second resin encapsulating the molded IC therein, and are connected to the first terminals outside the second resin.

* * * * *